(12) United States Patent
Fischer et al.

(10) Patent No.: US 10,262,980 B2
(45) Date of Patent: Apr. 16, 2019

(54) LED MODULE

(71) Applicant: BUNDESDRUCKEREI GMBH, Berlin (DE)

(72) Inventors: Jörg Fischer, Berlin (DE); Jakob Hille, Berlin (DE); Markus Tietke, Berlin (DE); Manfred Paeschke, Wandlitz (DE)

(73) Assignee: BUNDESDRUCKEREI GMBH, Berlin (DE)

( * ) Notice: Subject to any disclaimer, the term of this patent is extended or adjusted under 35 U.S.C. 154(b) by 0 days.

(21) Appl. No.: 15/534,953

(22) PCT Filed: Dec. 3, 2015

(86) PCT No.: PCT/EP2015/078467
§ 371 (c)(1),
(2) Date: Jun. 9, 2017

(87) PCT Pub. No.: WO2016/091704
PCT Pub. Date: Jun. 16, 2016

(65) Prior Publication Data
US 2017/0373049 A1    Dec. 28, 2017

(30) Foreign Application Priority Data

Dec. 12, 2014 (DE) .......... 10 2014 225 720

(51) Int. Cl.
*H01L 25/16* (2006.01)
*H05B 33/08* (2006.01)

(52) U.S. Cl.
CPC .......... *H01L 25/167* (2013.01); *H05B 33/08* (2013.01)

(58) Field of Classification Search
CPC .......... H01L 25/167; G06K 19/07783; G06K 19/07754; H04B 5/0056; H04B 5/0081; H05B 33/08
See application file for complete search history.

(56) References Cited

U.S. PATENT DOCUMENTS

| 2008/0308641 A1 | 12/2008 | Finn |
| 2009/0237248 A1* | 9/2009 | Clemens ............ G06K 19/0723 340/572.1 |
| 2010/0071746 A1* | 3/2010 | Furumura .......... G06K 19/0704 136/244 |

FOREIGN PATENT DOCUMENTS

| DE | 102006008345 B3 | 8/2007 |
| DE | 102008024780 A1 | 11/2009 |
| DE | 102010028444 A1 | 11/2011 |
| DE | 102012203251 A1 | 9/2013 |
| DE | 102013210842 A1 | 12/2014 |
| EP | 1134694 A1 | 9/2001 |

(Continued)

OTHER PUBLICATIONS

Machine Translation of DE 10 2012 203251.*

(Continued)

*Primary Examiner* — Julia Slutsker
(74) *Attorney, Agent, or Firm* — J. Clinton Wimbish; Nexsen Pruet, PLLC

(57) ABSTRACT

The invention relates to an LED module with a circuit which comprises an LED (106) and a resonant circuit (106, 108, 110) for coupling in energy for operation of the LED, wherein the circuit is formed without connections and is fully encapsulated in the LED module.

20 Claims, 3 Drawing Sheets

(56) References Cited

FOREIGN PATENT DOCUMENTS

WO      2013114244 A1    8/2013

OTHER PUBLICATIONS

International Search Report and Written Opinion issued in corresponding International Application No. PCT/EP2015/078467 dated Apr. 15, 2016, 10 pages.
Notification of Transmittal of Translation of the International Preliminary Report on Patentability for corresponding International Application No. PCT/EP2015/078467, 10 pages.
Das Fraunhofer et al., "Transponder Systeme (RFID) @BULLET Transponder Systeme @BULLET Passive Systeme @BULLET Aktive Systeme @BULLET Design und Simulation @BULLET Aufbauund Verbindungstechnik @BULLET Produktionstechnik @BULLET Service und Leistung des Fraunhofer JZM TransponderSysteme", Apr. 1, 2011 (Apr. 1, 2011), XP055263976, retrieved from the internet:URL:http://www.izm.fraunhofer.de/content/dam/izm/en/documents/Publikationen/Themenbroschueren/trnsp04d.pdf[retrieved on Apr. 8, 2016]; 6 pgs.

* cited by examiner

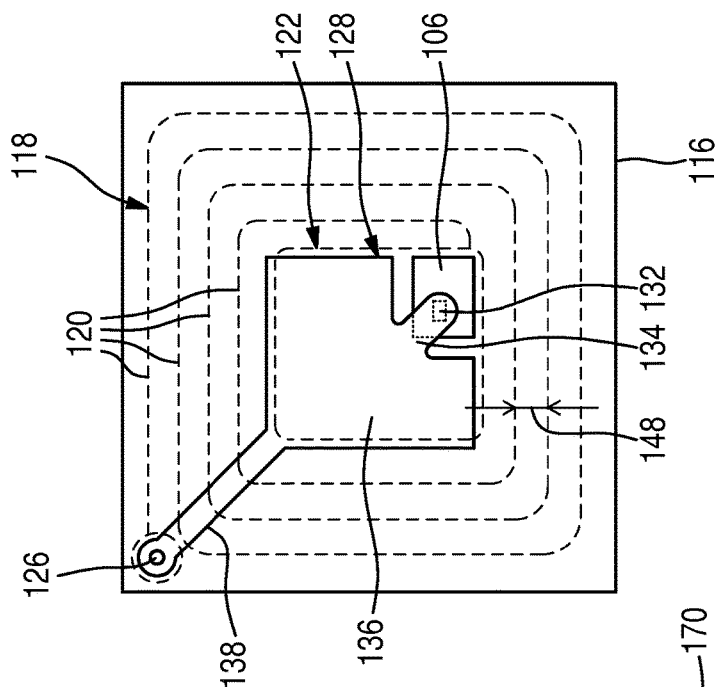
Fig. 2
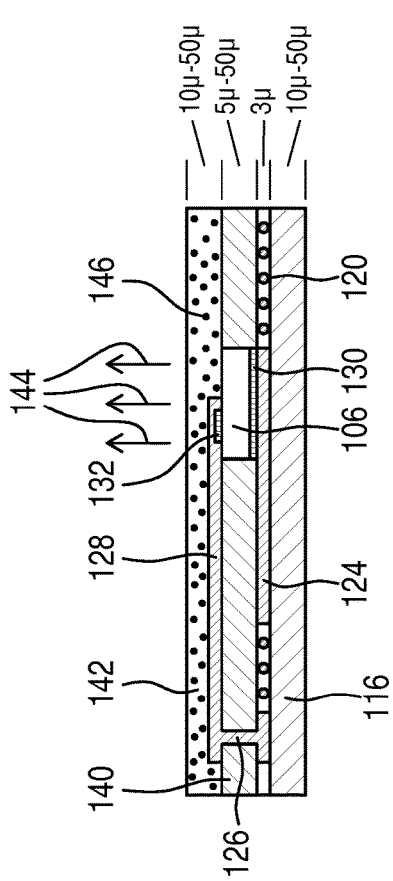
Fig. 3
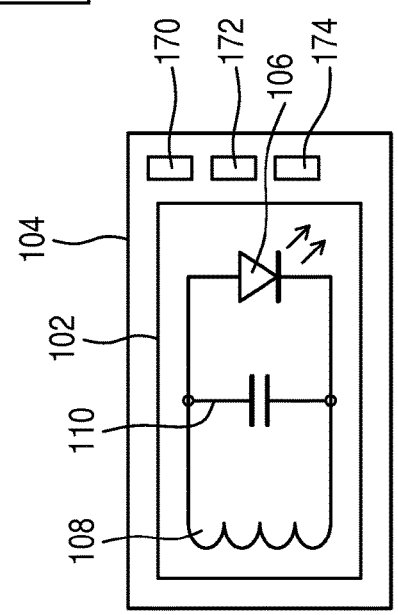
Fig. 1
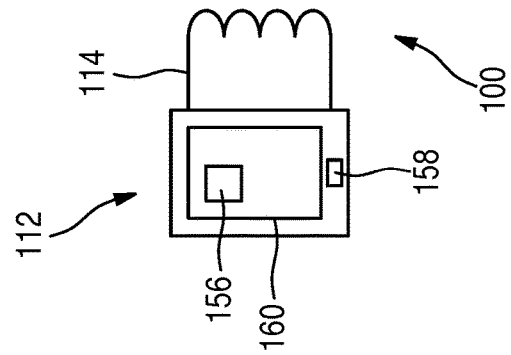

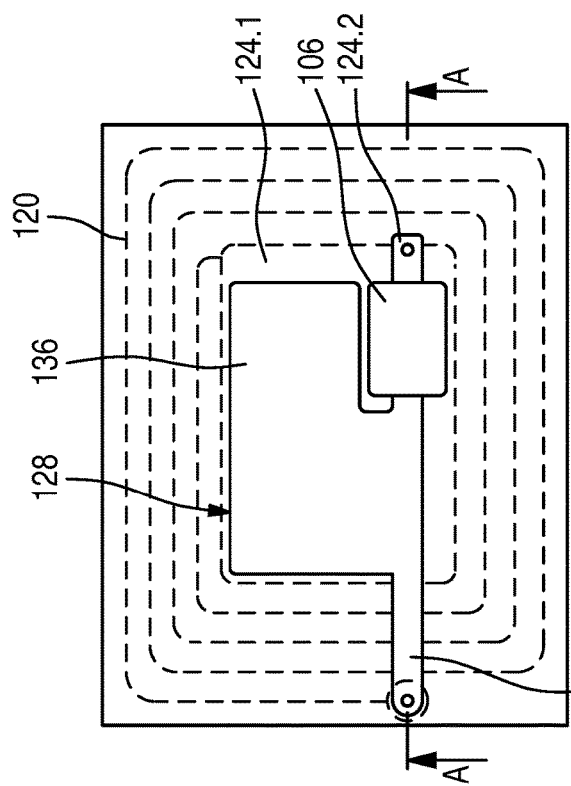
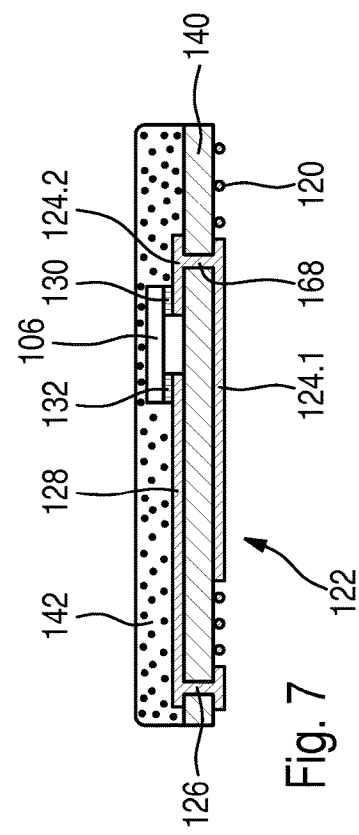
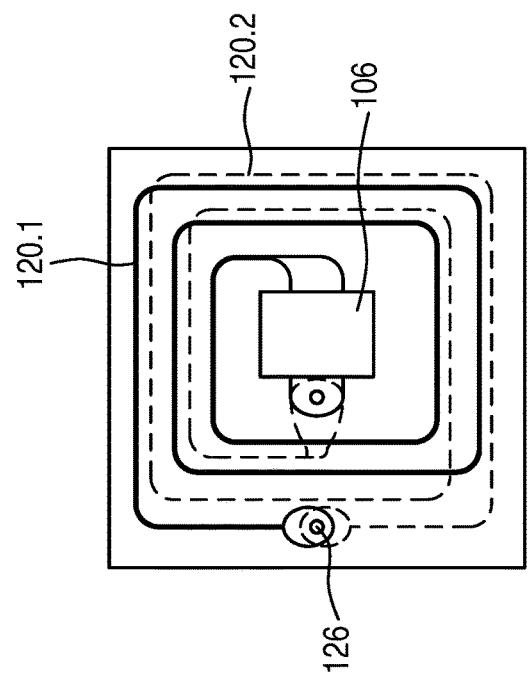
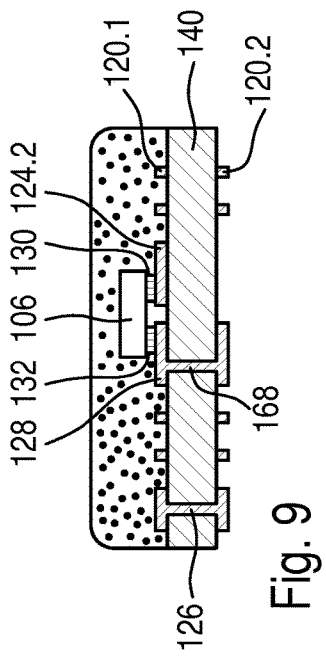

LED MODULE

CROSS REFERENCE TO PRIORITY APPLICATIONS

This application is a U.S. National Phase of PCT/EP2015/078467, filed Dec. 3, 2015, which claims the benefit of German Application No. 10 2014 225 720.4, filed Dec. 12, 2014, each of which are incorporated by reference in their entireties.

The invention relates to an LED module and an electronic system.

An LED module in which an LED is directly connected to a substrate is known from DE 10 2012 218 927 A1.

A further method for producing an LED module of this type is known from DE 10 2013 106 858 A1.

The object of the invention is to create an improved LED module which is suitable in particular as a security feature for checking the authenticity of documents of value or of security document or movable goods.

The problem addressed by the invention is achieved by the features of the independent claims. Embodiments of the invention are specified in the dependent claims.

Embodiments of the invention relate to an LED module with a circuit which comprises an LED and a resonant circuit for the electromagnetic coupling-in of energy for operation of the LED, wherein the circuit is formed without connections and is fully encapsulated in the LED module.

The term "formed without connections" is understood here in particular to mean that the LED module does not have any connections for galvanically contacting the LED module.

The term "fully encapsulated" is understood in particular to mean that no part of the circuit arranged in the LED module is accessible from outside without destruction.

In accordance with embodiments of the invention, the sole possibility to address the LED module is to couple energy into the resonant circuit inductively. Only in this way can this resonant circuit supply the LED with electrical energy so that the LED then lights up.

In accordance with embodiments of the invention, the LED is an organic light-emitting diode (LED).

In accordance with embodiments of the invention, the capacitance of the resonant circuit is formed exclusively by the parasitic capacitance of an antenna of the circuit and also by the capacitance of the LED itself, such that no additional component for providing a capacitance for the resonant circuit is necessary. This enables a miniaturisation of the circuit.

In accordance with embodiments of the invention, the parasitic capacitance of the antenna is formed by a plurality of antenna windings, which are arranged on a substrate, wherein the width of the antenna conductive track forming the antenna winding and also the distance between the antenna windings are selected such that a desired resonance frequency of the resultant resonant circuit is set.

In accordance with embodiments of the invention, antenna windings of the antenna run on both sides of one of the layers of the LED module in order to increase the parasitic capacitance of the antenna.

In accordance with embodiments of the invention the LED module has a layered structure, wherein on a first layer there are arranged a first electrode for contacting the LED and an antenna having a plurality of antenna windings, which run around the first electrode. The first layer is followed by a second layer, which contains the LEDs contacted with the first electrode and also a dielectric. This layer is followed by a third layer, which contains the second electrode of the LEDs and which is electrically connected to the antenna by means of a via running through the second layer. A capacitance is formed by the first and second electrodes of the LED and the dielectric of the second layer disposed between the first and second electrodes and is connected parallel to the capacitance of the LEDs.

In accordance with embodiments of the invention one of the layers carries both the first and the second electrode. The layer in question then itself forms the dielectric.

In accordance with one embodiment the antenna windings run along an edge region of the LED module so that the antenna windings form a coil opening, which for example lies in a central region of the LED module. The first electrode can then be formed such that it fills this coil opening completely or partially. The second electrode can be formed such that it extends over the first electrode and covers it completely or partially so as to create a capacitance of corresponding magnitude. The second electrode has a protrusion, which connects the region of the second electrode covering the first electrode to the via, wherein the protrusion extends over the antenna windings.

In accordance with embodiments the resonant circuit of the LED module has a resonance frequency between 125 kHz and 2.5 GHz, in particular between 10 MHz and 16 MHz, for example 13.56 MHz, such that the resonant circuit can be excited by an external electronic unit, which comprises a primary resonant circuit, by coupling energy in inductively, wherein the external electronic unit for example is a contactless reader for chip cards, a point-of-sale terminal, or a mobile radio unit, in particular a mobile phone or smartphone, which for example is equipped with an RFID or NFC interface, which emits an electromagnetic field, for example in the region of 13.56 MHz.

In accordance with embodiments of the invention the LED module is operated in a far field region or in a close field region, preferably in a close field region at a frequency of 13.56 MHz.

In accordance with an embodiment of the invention the layer contains an optically effective material so as to hereby modulate the light emitted by the LED so as to thus create a further security feature. By way of example, the following substances can be considered as optically effective material: fluorescent or phosphorescent substances, dyes for filtering the emitted light, conversion phosphors (for example upconversion (light frequency upconversion) or downconversion (light frequency downconversion)) for shifting the emission spectrum of the emitted light, effect pigments, for example metal oxide particles, or retroreflective particles.

In accordance with embodiments of the invention the following materials are used for the LEDs so as to enable different colours:

Gallium arsenide (GaAs), aluminium gallium arsenide (AlGaAs), gallium arsenide phosphide (GaAsP), aluminium gallium indium phosphide (AlGaInP), gallium phosphide (GaP), indium gallium nitride (InGaN), aluminium gallium nitride (AlGaN), gallium nitride (GaN).

With a preferred use of a blue or an ultraviolet LED, luminescent dyes are arranged above the LED (for example in the cover layer or in an object disposed thereabove) in order to generate white, red, green, yellow and/or orange light.

Embodiments of the invention are particularly advantageous since the LED module enables an integration in plastic films, paper, textiles, banknotes, and card documents, for example by being inserted or interspersed during the film extrusion or paper production, since the LED module can have a very thin and small design.

Embodiments of the invention are particularly advantageous since they enable a miniaturisation of the LED module. A miniaturised LED module of this type can form an integral element for example of the document body of a document of value or security document or of a movable good so as to enable a comfortable authenticity check. Here, it is particularly advantageous that electronic units usually provided anyway, such as smartphones with NFC interface or point-of-sale terminals, can be used for the authenticity check.

A "document of value or security document" are understood here to mean paper-based and/or plastic-based documents, such as identity cards or other ID documents, in particular passports, personal identity cards, visas and driver's licenses, vehicle registration certificates, vehicle registration documents, company identification cards, health insurance cards or other ID documents and also chip cards, payment means, particularly banknotes, bank cards and credit cards, consignment notes, gift vouchers or shopping vouchers, or other proofs of authority, revenue stamps, postal stamps, tickets, (gaming) chips or adhesive labels.

The document of value or security document can be present in ID 1, ID 2, ID 3 or in any other format, for example in the form of a booklet, as is the case with a passport-like article. A document of value or security document is generally a laminate formed of a number of document layers, which are connected flat to one another in perfect alignment under the effect of heat and at increased pressure. Alternatively, these documents can also be produced by injection moulding or extrusion. The documents can meet the standardised requirements, for example ISO/IEC 10373, 7810, 14443. The document layers preferably consist of a document carrier material which is suitable for lamination.

Embodiments of the invention are particularly advantageous since one or more of the LED modules can be integrated or applied in paper, plastic or textile materials on account of the miniaturisation.

In accordance with embodiments of the invention the LED modules for example are interspersed in the pulp or are added to the paper web during the paper production, provided the paper web still has a high water content, for example of more than 8%. A paper in which LED modules according to the invention can be completely embedded is thus obtained. A paper of this type is particularly suitable for further processing into a document of value or security document, in particular a banknote.

In accordance with an embodiment of the invention, during the production of a plastic part, one or more LED modules is/are added to the plasticised plastic from which the plastic part is to be produced. This can be implemented for example in an extrusion process or in a plastic injection-moulding process. In this case, a plastic part which contains one or more of the LED modules as integral element is obtained.

In accordance with an embodiment of the invention the LED modules are added to the plasticised plastic prior to a film extrusion so that a plastic film comprising the embedded LED modules is obtained. A plastic film of this type can be further processed for example for the production of a chip card, wherein a layer of the chip card which has been produced from a film of this type can then contain one or more of the LED modules.

In accordance with embodiments of the invention an LED module which is intended to be integrated in paper, in particular a banknote paper, is firstly coated, for example by immersion or rinsing. By way of example, the following materials can be considered for the coating: thermoplastic urethanes or elastomers (TPU, TPE) or latent reactive adhesives, such as isocyanates. The LED module coated in this way is added during the paper production process before curing the urethane, elastomer or the latent reactive adhesive, and then cures as the paper web is dried, such that a particularly close connection to the surrounding paper material is provided. A local stiffening of the paper material and therefore an increased mechanical protection of the LED module is also produced as a result.

In accordance with a further embodiment of the invention an LED module can be applied to a document of value or security document, such as a banknote or a chip card, together with a foil application, such as a hologram strip or a window.

In accordance with a further embodiment the invention relates to a piece of jewelry in which one or more LED modules according to the invention is/are integrated. This can serve for the purpose of checking the authenticity of the piece of jewelry and/or as a decorative element or optical transmitter.

If, by way of example, the wearer of the piece of jewelry is carrying a conventional smartphone with an NFC interface, the NFC interface can be controlled by an application program, i.e. what is known as an app, of the smartphone in order to control the LED module permanently or in a situation-dependent manner. By way of example, control by means of the app is provided only if the user is in specific geographical positions, which are determined by the smartphone, for example with the aid of a GPS function, or if the smartphone senses that for example the smartphone of another user is located in the vicinity.

In an embodiment of the present invention the at least one antenna conductive track can be printed onto one of the layers by means of a conductive paste or conductive ink. The antenna conductive track is preferably formed as a printed layer with electrically conductive pigment particles. The antenna conductive track can be applied to the display carrier of the display module by means of conventional printing techniques. The thickness of the printed-on paste or of the varnish can be in particular 1 µm to 100 µm and particularly preferably approximately 10 µm.

The conductive paste of the conductive varnish can be either simply dried or can be cured by means of heat and/or irradiation with electromagnetic radiation, for example UV radiation. The conductive paste or conductive ink contains at least one polymer as binder and also at least one metal and/or a conductive metal oxide and/or other conductive material in the polymer.

Copper, silver, gold, iron, zinc or carbon, in particular graphite, single-wall and/or multi-wall nanotubes, fullerenes or graphene are potential conductive material. ITO (indium tin oxide), IZO, FTO (fluorine-doped tin dioxide), and ATO (antimony oxide) are potential metal oxides. The metals/metal oxides can be present in the form of flakes, needles, powders (in particular nanoscale powders), platelets or the like. In particular, these are present as aggregated particles. Conductive organic materials/polymers, for example polyaniline, PEDOT:PSS, are potential other conductive materials. Examples of suitable materials for the production of the antenna conductive tracks are products from the company NanoChemonics, NM, USA. Further examples of suitable inks or coating agents are the products IJAg-150-Fx or AG-IJ-G100-51 (silver base with particle diameter between 30 and 50 nm), which can be applied by means of inkjet printing. These coating agents are additionally characterised in that a conductive layer is created only by an activation step, for example laser irradiation with 500 to 580 nm, by means of the sintering of the particles. The layer, which is not conductive per se, is made highly conductive by the irradiation. Lastly, screen printing inks comprising conductive particles from the companies Dupont (5028 or 5029) and Spraylat can be used, which experience an increase, in particular a multiplication, in their conductivity by the action of heat, or structuring techniques can be used, as are known per se from the field of semiconductor manufacture.

In particular the antenna conductive track can be produced in an etching technique from aluminium or copper by means of an etching resist or can be produced in a pattern-plating method. In the case of pattern-plating methods, these structures are initially formed as channels starting from a base metallisation, for example made of copper, with a plating resist on the base metallisation. Additional metal is then deposited by means of electroplating. Once the plating resist has been removed, the base metallisation between the structures is removed by etching or by means of laser direct imaging (LDI) or laser ablation or milling. Amongst others, FR4, polyimide and PC are potential substrate materials.

In accordance with embodiments of the invention the document of value or security document is, as specified above, formed by a document body made of one or more layers of thermoplastically processable plastics, wherein the above-mentioned polymers are the thermoplastically processable plastics. This ensemble is then collated with further outer polymer layers, which close off the central polymer layers and the display module on the upper side and on the underside. The stack is then connected by lamination to form a monolithic block. For this purpose, a document of value or security document can be produced in a heating and cooling press at a temperature up to approximately 200° C. and at a pressure of approximately 300 to 500 $N/cm^2$ in the heating press cycle and approximately 500 to 700 $N/cm^2$ in the cooling press cycle. These values are applicable for documents made of polycarbonate. Adapted temperatures are used for other materials. In an alternative embodiment the outer polymer layer, i.e. the cover layer, disposed on the upper side can also be omitted. In this case the laminated document blank is then provided with a protective lacquer.

In a further aspect the invention relates to an electronic system comprising an electronic unit and at least one LED module, which electronic system can belong to a document of value or security document or another movable good, for example a piece of jewelry. Due to the electronic unit, such as a point-of-sale terminal or a smartphone, the LED is triggered to light up preferably by inductively coupling electrical energy from the primary resonant circuit of the electronic unit into the resonant circuit of the LED module, such that an authenticity check and/or a decorative effect is hereby provided.

In accordance with one embodiment of the invention the movable good is a textile product, such as an item of clothing, an electronic unit, such as a computer, a machine part, a replacement part, a pharmaceutical drug or a high-value beverage or a packaging or container for a valuable or safety-relevant product. By applying embodiments of the system according to the invention a potential end user of the good can be convinced of its authenticity prior to purchase. Furthermore, intermediaries, chain stores and the like wishing to offer such goods to the end user can also be certain of the authenticity of the goods which they are offering.

In accordance with embodiments of the invention the electronic unit is designed such that it checks the validity of the LED module, preferably before energy is coupled into the LED module by the electronic unit for operation of the LED. In order for the LED module to be considered as valid, a property of the circuit must be checked.

This property of the circuit can be the resonance frequency of the circuit, for example. The resonance frequency can be checked indirectly in that the electronic unit sends a pulse to the LED module, whereupon the LED module answers with a pulse response. This pulse response is dependent on the transfer function of the LED module and therefore also on the resonance frequency thereof.

The reader compares the pulse response received from the LED module with first reference data. If there is a sufficient match between the received pulse response and the first reference data, the LED module is considered to be valid and the electronic unit then controls its primary resonant circuit so as to couple energy into the LED module at the resonance frequency of the LED module. As a result, even at higher frequencies, a high coupling factor is provided between the electronic unit and the LED module, such that sufficient energy for operation of the LED is coupled into the LED module.

The security is also increased as a result of this measure, since the LED can light up only once the validity of the LED module has been checked.

In accordance with one embodiment of the invention the light emitted by the LED is detected using an optical sensor. The sensed light is compared, by way of example in terms of its spectral composition, with second reference data. If there is a sufficient match between the sensed light and the second reference data, a signal is generated by the electronic unit, said signal indicating the match.

In accordance with one embodiment of the invention a smartphone or tablet PC is used as electronic unit. Here, the RFID or NFC interface of the smartphone or tablet PC forms the primary resonant circuit. It is particularly advantageous if the LED light is detected using the camera of the smartphone or tablet PC, since no additional unit is then necessary. The control of the primary resonant circuit and also the output of the signal indicating the validity in the event of a sufficient match between the sensed lights and the reference data can be implemented by an application program, i.e. what is known as an app, which is installed on the smartphone or the tablet PC.

Embodiments of the invention will be explained in greater detail hereinafter with reference to the drawings, in which:

FIG. 1 shows an embodiment of an electronic system according to the invention,

FIG. 2 shows a plan view of an embodiment of an LED module according to the invention, FIG. 3 shows a sectional view of the embodiment according to FIG. 2.

FIG. 6 shows a plan view of an alternative embodiment of an LED module according to the invention, FIG. 7 shows a sectional view of the embodiment according to FIG. 6, FIG. 8 shows a plan view of an alternative embodiment of an LED module according to the invention, FIG. 9 shows a sectional view of the embodiment according to FIG. 8.

Figure 4:
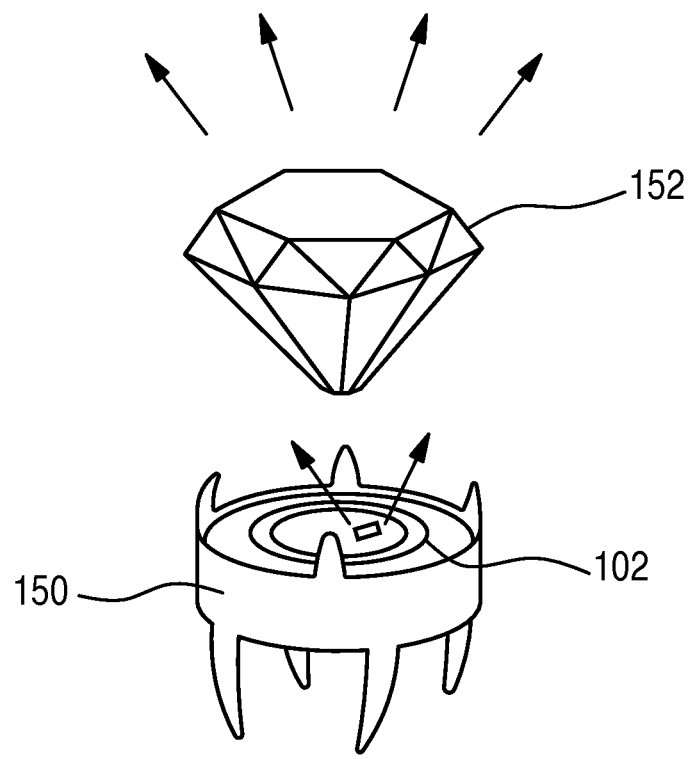
FIG. 4 shows an exploded view of an embodiment of a piece of jewelry according to the invention.

Elements of the following embodiments which correspond to one another or which are the same as one another are denoted by the same reference signs in each case.

FIG. 1 shows an embodiment of an electronic system 100 according to the invention. The electronic system 100 contains at least one LED module 102, which can be arranged in or on a movable good 104.

The LED module contains a circuit with an LED 106 and a resonant circuit which is formed by an inductor 108 and a capacitor 110, wherein the capacitor 110 is connected here in parallel with the LED 106 so that the total capacitance of the resonant circuit is given by the sum of the capacitor 110 and the capacitance of the LED 106. The resonance frequency of the resonant circuit is determined by this total capacitance and the inductor 108.

The circuit is fully encapsulated in the LED module 102 and is formed without connections. The only possibility for controlling the LED is to couple energy into the resonant circuit inductively so that the LED 106 lights up. For this purpose, the electronic system 100 has an electronic unit 112, which has field generation means, that is to say a primary resonant circuit 114, in order to excite the resonant circuit of the LED module 102. The primary resonant circuit 114 is preferably tailored to the resonant circuit of the LED module 102, that is to say the excitation occurs at the resonance frequency.

By way of example, the electronic unit 112 can be a point-of-sale terminal, as is used for example in the retail sector, for example in a supermarket. If the movable good 104 for example is a payment means, such as a banknote or a chip card, an authenticity check can be carried out at the point-of-sale terminal in that the point-of-sale terminal couples electrical energy into the resonant circuit so that the lighting-up of the LED signals the authenticity.

The electronic unit can also be a mobile radio unit, for example what is known as a smartphone, with an RFID or NFC interface, which performs the function of the primary resonant circuit 114. Alternatively, the electronic unit 112 can also be a contactless chip card terminal, for example with an NFC and/or RFID interface.

The LED module 102 can have a miniaturised design. By way of example, the thickness of the LED module 102 can be between 30 µm and 5000 µm and it can have lateral dimensions of, for example, 500 µm·500 µm up to 3 mm·3 mm.

The electronic unit 112 by way of example can be a battery-operated portable unit, for example a smartphone or a tablet PC. An application program, that is to say what is known as an app 156, is installed on the electronic unit 112 and can be started by a user via a user interface of the electronic unit, such as a touch-sensitive display, that is to say what is known as a touch panel 160. The electronic unit 112 can also have an optical sensor, such as a camera 158.

By way of example, the following approach is adopted in order to check the LED module 102:

1. The user starts the app 156. The app 156 then controls the primary resonant circuit 114 to send a pulse. This pulse can be what is known as a unit pulse, which is also referred to as a Dirac pulse.
2. The LED module 102 uses its antenna 118 to receive the pulse from the electronic unit 112. The circuit of the LED module 102 responds to this pulse with a pulse response, which is characteristic for the transfer function and therefore the resonance frequency of the LED module 102. This pulse response is sent from the antenna 118 and is received by the electronic unit 112 with the aid of the primary resonant circuit 114.
3. The electronic unit 112 has a memory, in which first reference data for the pulse response are stored. The app 156 accesses this memory in order to read the reference data and in order to check the received pulse response for a match with the reference data. If there is a sufficient match, the app 156 controls the primary resonant circuit 114 such that this excites the resonant circuit of the LED module 102 with the resonance frequency thereof.
4. The app 156 then controls the camera 158 so that the light emitted by the LED 106 on account of the coupling-in of energy is sensed.
5. Second reference data for the sensed light are stored in the memory of the electronic unit 112. The app 156 accesses this reference data in order to compare the sensed light with the reference data. In the event of a sufficient match, the LED module 102 is considered to be valid and the app 156 generates a corresponding signal, which for example is output from the electronic unit 112 as an optical signal on the touch panel 160 and/or as an acoustic and/or as a haptic signal, that is to say as a vibration signal, so that the user is informed of the successful check of the validity of the LED module 102.

The movable good 104 can be a document of value or a security document. The movable good 104 can be a protected data memory 170, in which personal data of a user are stored, for example, as is the case for example with an electronic personal ID card in the Federal Republic of Germany. The movable good 104 can also comprise a processor 172, which is configured to allow external access to the data memory 170 via communication interface 174 only if a cryptographic protocol for authentication and/or authenticity check of an external reader, for example the electronic unit 112, has been carried out successfully. This can be, for example, what is known as a basic access control (BAC) and/or an extended access control (EAC). The communication interface 174 can be formed as a contactless interface, for example as an RFID or NFC interface. The LED module is electrically connected neither to the processor 172 nor to the communication interface 174.

FIG. 2 shows a plan view of an embodiment of an LED module 102 according to the invention. The LED module 102 has a substrate 116, for example made of ceramic or plastic, such as polyimide or polyamide. An antenna 118 is arranged on the substrate 116, in that an antenna conductive track 120 is arranged on the substrate 116 in a plurality of windings.

The windings of the antenna conductive track 120 run along an edge region of the substrate, such that an antenna coil is formed as a result, which has a coil opening 122 in a central region of the substrate 166. An electrode 124 (see FIG. 3) of the LED 106 is arranged in the region of this coil opening 122.

The electrode 124 fills the coil opening 122 on the substrate 116 completely or partially. A first end of the antenna conductive track 120 is electrically connected to the electrode 124. The other end of the antenna conductive track is electrically connected to a second electrode 128 of the LED 106 by means of a via 126.

By way of example, the LED 106 has a first protuberance 130 for connection to the electrode 124 and a second protuberance 132, which is preferably arranged at the edge of the LED 106, so as to provide the largest possible discharge area for the emission, wherein the second protuberance 132 serves for the electrical connection to the second electrode 128.

The second electrode 128 has a first protrusion 134, which extends within the coil opening 122, in order to electrically connect a second electrode 128 to the protuberance 132. The second electrode 128 also has a flat region 136, which extends over the coil opening 122 and covers this and the first electrode 124 arranged there-beneath completely or partially. The electrode 128 also has a second protrusion 138, which connects the flat region 136 to the via 126, wherein the protrusion 138 extends over the antenna windings formed by the antenna conductive track 120.

In the case of the embodiment considered here, a first layer of the LED module 102 is formed by the substrate 116. The following second layer 140, besides the LED 106, also contains a dielectric, that is to say a material having a high relative permittivity, such as benzocyclobutene (BCB) or another polymer, which is filled with inorganic substances, such as ormocers and/or inorganic substances, such as titanium dioxide, barium titanate or lead zirconium titanate.

In an alternative embodiment (see embodiment in FIGS. 6, 7 and 8 and 9), the substrate 116 can function itself as dielectric, wherein the electrode 124 and the antenna conductive track 120 are arranged on one side of the substrate the electrode 128 is arranged on the opposite side of the substrate and the via 126 runs through the substrate, wherein the LED 106, depending on the embodiment, can be arranged on one side or the other side of the substrate or in a cavity or an opening in the substrate.

In accordance with the embodiment according to FIG. 2 and FIG. 3, the second layer 140 is followed by a third layer 142, specifically a cover layer, which closes off the LED module 102 outwardly and in particular covers the electrode 128 and the LED 102. The LED module 102 is thus completely encapsulated towards the outside, such that none of the components of the circuit formed in the LED module are accessible from outside without destroying the LED module, unless energy is coupled into the resonant circuit of the circuit inductively and contactlessly.

The substrate 116 for example has a thickness of from 10 µm to 50 µm. The metallisation layer applied to the substrate 116, by means of which layer the electrode 124 and antenna conductive path 120 are formed in particular, has a thickness for example of from 1 to 6 µm, for example 3 µm. The subsequent layer 140 with the dielectric and the LED 102 has a thickness by way of example of from 5 µm to 50 µm, and the cover layer, that is to say the layer 142, has a thickness of from 10 µm to 50 µm, for example.

The layer 142 for example can consist of an epoxy material. The layer 142 at least in the region of the light path of the light 144 emitted by the LED 106, can also contain one or more optically effective materials 146, which serve to provide an additional security feature and/or decorative effect and/or which can provide the emitted light 144 with additional information.

The LED module 102 can be produced using structuring techniques known per se.

A capacitance is formed by the electrodes 124 and 128 arranged opposite one another and the dielectric of the layer 140 disposed therebetween, which capacitance enters the capacitor 110. The parasitic capacitance of the antenna 118, which is caused primarily by the antenna windings of the antenna conductive track 120 running parallel to one another, also enters this capacitor 110.

Depending on the embodiment, the parasitic capacitance of the antenna 118 can be sufficient to reach a desired resonance frequency of the resonant circuit of the LED module 102, such that the flat region 136 can be omitted completely or partially. In this case, a further miniaturisation of the LED module 102 is made possible.

If the width of the antenna conductive track 120 is for example 10 µm and the distance 148 between two adjacent windings of the antenna conductive track 120 is for example 10 µm and the area of the substrate 116 by way of example is 2 mm·2 mm, this thus gives, with a number of 40 antenna windings, an inductor 108 of 1.8 µH, such that a capacitor 110 of 76 pF is necessary in order to arrive at a desired resonance frequency of 13.56 MHz. In this case the design of the electrode 128 with the flat region 136 is preferred in order to reach this total capacitance 110.

If, by contrast, the substrate 106 has a size of merely 3 mm·3 mm for example and the width of the antenna conductive track 120 is reduced for example to 5 µm and the distance 148 is reduced to 5 µm, an inductor of 10.6 µH is thus provided, in the case of a winding number of 46. In this case the parasitic capacitance of the antenna 118 together with the capacitance of the LED 106, which for example is 13 pF, is sufficient to bring the resonant circuit of the LED module 102 to the resonance frequency of 13.56 MHz.

In accordance with further embodiments of the invention it is possible to provide the circuit of the LED module 102 with more than one LED, for example anti-parallel LEDs, so as to hereby create a higher capacitance 110 with a smaller antenna coil, so as to thus enable even smaller external dimensions of the LED module 102.

FIG. 4 shows an embodiment of a piece of jewelry according to the invention with a mount 150 for a decorative element 152, for example a crystal, for example a polished crystal glass precious stone or semi-precious stone, a pearl, or another decorative element. At least one LED module 102 is arranged on the decorative element 152 or the mount 150.

By way of example, the decorative element 152 is transparent or semi-transparent, so that light emitted by the LED module 102 can pass through the decorative element 152, such that the decorative element 152 lights up if energy is coupled inductively into the LED module 102. In this case the LED module 102 is preferably arranged beneath the decorative element 152 in the mount 150, which for example can be formed as a prong setting. Alternatively, the decorative element 152 is fixed by adhesive bonding or magnetic holder.

Figure 5:
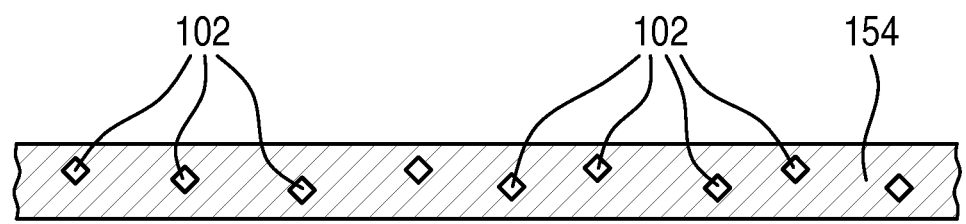
FIG. 5 shows a sectional view of an embodiment of a paper, plastic or textile material according to the invention.

FIG. 5 shows a cross-section through a material layer 154. The material layer 154 can be, for example, a paper, in particular for the production of banknotes or other documents of value or security documents. A plurality of LED modules 102 is arranged in a distributed manner in the material layer 154 and is completely embedded in the material layer 154. This can be achieved by adding the LED modules 102 to the pulp or to the paper web, when this is not yet dry or not yet fully dry, during the paper production process. The LED modules 102 are preferably coated beforehand with an adhesive, which cures following the addition to the pulp or paper web so as to thus form a particularly close bond with the surrounding paper.

The material layer 154 for example can also be a plastic, in particular a plastic film, as is also used in the production of documents of value or security documents, in particular in the production of chip cards. In this case, in order to produce the material layer 154, the LED modules 102 are added to the already plasticised plastic in order to then form the material layer 154 by a plastic injection-moulding or extrusion step, said material layer then solidifying with the LED modules 102 enclosed therein.

The material layer 154 for example can also be the wall of a component, such as the wall of a movable good, in particular for example of a movable good which consists wholly or partially of plastic, for example a drinks bottle, or a piece of jewelry.

FIGS. 6 and 7 show an embodiment of the invention in which the connections of the LED 106, that is to say the protuberances 130 and 132, are arranged on the same side of the LED 106. In this embodiment the first electrode 124 is formed by the two electrode portions 124.1 and 124.2, which are connected to one another by means of a via 168, which runs through the layer 140. Here, the antenna portion 124.1 is arranged within the coil opening 122 and fills this opening completely or partially, as is also the case in accordance with the embodiments according to FIGS. 2 and 3. As a result of the mutually opposed electrode 128 and the electrode portion 124.1 with the layer 140 arranged therebetween, said layer forming a dielectric, a capacitance is formed, which enters the capacitor 110 of the circuit.

In contrast to the embodiment according to FIGS. 2 and 3, the layer 140 in the case of the embodiment considered here has a dual function, specifically the function of the substrate and the function of a dielectric. An even smaller overall height can be attained as a result. The complete encapsulation of the LED module 102 in the embodiment according to FIG. 7 can be achieved in that a layer 142 is also applied to the underside, or in that the LED module 102 is embedded in a material layer 154 (see FIG. 5).

FIGS. 8 and 9 show an embodiment of the LED module 102 in each of which an antenna conductive track 120.1 runs on the upper side of the layer 140 and an antenna conductive track 120.1 runs on the rear side of the layer 140, such that the layer 140 lying between the antenna conductive tracks 120.1 and 120.2 acts as a dielectric with regard to the parasitic capacitance of the mutually opposed antenna conductive tracks. In this embodiment the connections, that is to say the protuberances 130 and 132 of the LED 106, are again arranged on the same side.

The protuberance 130 is connected to the antenna conductive track 120.1, which is connected to the antenna conductive track 122.2 by means of a via 126. The end of the antenna conductive track 120.2 is connected to the other protuberance 132 of the LED 106 by means of a further via 168. By means of this arrangement of the antenna 118, a relatively large parasitic capacitance is generated, such that the flat region 136 or a flat design of the electrode 124 or of the electrode portion 124.1 can be omitted here completely or partially.

LIST OF REFERENCE SIGNS 100 electronic system
102 LED module
104 movable good
106 LED
108 inductor
110 capacitor
112 electronic unit
114 primary resonant circuit
116 substrate
118 antenna
120 antenna conductive track
122 coil opening
124 electrode
126 via
128 electrode
130 protuberance
132 protuberance
134 protrusion
136 flat region
138 protrusion
140 layer
142 layer
144 light
146 material
148 distance
150 mount
152 decorative element
154 material layer
156 app
158 camera
160 touch panel
168 via
170 memory
172 processor
174 communication interface

The invention claimed is:

1. An LED module with a circuit, comprising:
a substrate layer;
a cover layer positioned on the substrate layer; and
an LED and a resonant circuit for coupling in energy for operating the LED, the LED and resonant circuit being positioned between the substrate layer and the cover layer,
wherein the circuit is fully encapsulated between the substrate layer and the cover layer, and is inaccessible from outside the LED module without destructively removing a portion of the substrate layer or the cover layer.

2. The LED module according to claim 1, comprising a dielectric material, wherein first and second electrodes for contacting the LED are arranged on opposite sides of the dielectric material, such that a capacitance for the resonant circuit is formed.

3. The LED module according to claim 2, comprising: a first layer comprising:
the first electrode and
an antenna having a plurality of antenna windings about the first electrode;
a second layer comprising:
the dielectric material, and
the LED, and
a third layer onto which the second electrode is positioned;
wherein a first end of the antenna is electrically connected to the first electrode,
wherein the second electrode is contacted with a second end of the antenna by means of a via through the second layer and a capacitance is formed by the first and second electrodes with the dielectric material arranged therebetween, such that the resonant circuit is formed.

4. The LED module according to claim 2, comprising a layer having the dielectric material, wherein a portion of the first electrode is positioned on one side of the layer and the second electrode is positioned on an opposite side of the layer, wherein the LED is positioned on the side of the layer having the second electrode and first and second connections are positioned on the side of the layer having the LED, wherein one of the connections of the LED is connected to the first electrode by means of a via which runs through the layer, and wherein a conductive track of an antenna of the resonant circuit is positioned on the same side of the layer as the first electrode and is connected to the second electrode by a via which runs through the layer, wherein the second electrode is connected to the second connection of the LED.

5. The LED module according to claim 3, wherein a resonance frequency of the resonant circuit is given by an inductance of the antenna and a sum of the capacitance of the LED and the capacitance formed by the first and second electrodes with the dielectric material disposed therebetween.

6. The LED module according to claim 3, wherein a coil opening is formed by the antenna windings and the first electrode is positioned in the coil opening, wherein a flat region of the second electrode extends over the coil opening, wherein the second electrode has a protrusion, which connects the flat region and the via to one another, wherein the protrusion extends over the antenna windings.

7. The LED module according to claim 3, wherein a capacitance for the resonant circuit is formed by a parasitic capacitance of the antenna windings.

8. The LED module according to claim 7, wherein the antenna windings are arranged on mutually opposed sides of the dielectric, wherein the antenna windings are connected to one another by means of vias.

9. The LED module according to claim 3, wherein width of a conductor of the antenna winding is between 5 and 15 μm and wherein distance between two adjacent antenna windings is between 5 μm and 15 μm and wherein the number of windings in the plurality of antenna windings is between 20 and 60 windings.

10. The LED module according to claim 1, wherein a material is arranged in a light path of light to be emitted by the LED, the material comprising a fluorescent or phosphorescent substance, dye for filtering the light, conversion phosphor, metal oxide particles, and/or retroreflective particles.

11. The LED module according to claim 1, wherein the resonance frequency of the resonant circuit is between 10 MHz and 16 MHz.

12. The LED module according to claim 1, wherein the LED has a thickness of less than 100 μm and the LED module has an overall height of less than 7000 μm, wherein a lateral dimension of the LED module is less than 5 mm.

13. A paper having one or more of the LED module according to claim 1 arranged in or on the paper.

14. A plastic or textile having one or more of the LED module according to claim 1 arranged in or on the plastic or the textile.

15. A document of value or security document having a document body in or on which one or more of the LED module according to claim 1 is/are arranged.

16. The document of value or security document according to claim 15 with a processor, a data memory and a communication interface, wherein the processor is configured to allow external access to the data memory via the communication interface only if a cryptographic protocol for authentication and/or authorisation check of an external reader has been carried out successfully, wherein the LED module is not controllable by the processor or via the communication interface.

17. A movable good, item of clothing, container, electronic unit, machine part, replacement part, pharmaceutical drug, or packaging with at least one LED module according to claim 1.

18. An electronic system with an electronic unit and a paper, plastic or a textile according to claim 13 or a document of value or security document according to claim 15, or a movable good according to claim 17, wherein the electronic unit comprises a primary resonant circuit for exciting the resonant circuit of the at least one LED module in order to check the authenticity of the paper, plastic, textile or of the document of value or security document or of the movable good by exciting the resonant circuit and the light then emitted by the LED module.

19. The electronic system according to claim 18, wherein the electronic unit is configured to detect a pulse response of the LED module and to check for a match with first reference data, and to excite the primary resonant circuit for excitation of the resonant circuit for operation of the LED module, such that the LED module lights up, only on a precondition that there is a match.

20. The electronic system according to claim 18, wherein the electronic unit comprises an optical sensor, wherein an LED module authenticity signal is generated by the electronic unit when light incident on the optical sensor from the LED module matches reference data.

* * * * *